United States Patent [19]

Bapat

[11] 3,774,055

[45] Nov. 20, 1973

[54] CLOCKED BOOTSTRAP INVERTER CIRCUIT

[75] Inventor: Dilip C. Bapat, Mountain View, Calif.

[73] Assignee: National Semiconductor Corporation, Santa Clara, Calif.

[22] Filed: Jan. 24, 1972

[21] Appl. No.: 220,092

[52] U.S. Cl. .................. 307/279, 307/208, 307/251, 328/176

[51] Int. Cl. .................. H03k 3/26

[58] Field of Search .................. 307/205, 251, 279, 307/208; 328/176

[56] References Cited

UNITED STATES PATENTS

| | | | |
|---|---|---|---|
| R27,305 | 3/1972 | Polkinghorn et al. | 307/251 X |
| 3,480,796 | 11/1969 | Polkinghorn et al. | 307/205 X |
| 3,646,369 | 2/1972 | Fujimoto | 307/279 X |
| 3,660,684 | 5/1972 | Padgett et al. | 307/251 X |
| 3,699,539 | 10/1972 | Spence | 307/205 X |

*Primary Examiner*—John S. Heyman
*Attorney*—Lowhurst & Hamrick

[57] ABSTRACT

A clocked bootstrap inverter circuit including an inverting amplifier, an active load for the inverting amplifier including a capacitive bootstrapping circuit, a biasing circuit responsive to a first clocking signal and a second clocking signal 180° out of phase with the first clocking signal, and an amplifier disabling device responsive to a third clocking signal which is more than 180° out of phase with the first clocking signal. The biasing circuit alternately activates and inactivates the active load while the disabling device alternately disables the amplifier and provides a small time delay for allowing the bootstrapping circuit to be precharged.

5 Claims, 3 Drawing Figures

CLOCKED BOOTSTRAP INVERTER CIRCUIT

RELATED APPLICATIONS

The present invention is related to the inventions disclosed in my previous applications entitled, "An Improved MOS Bootstrap Inverter Circuit," U.S. Pat. Ser. No. 176,128, filed Aug. 30, 1971, and "Isolated Bootstrap Inverter Circuit," U.S. Pat. Ser. No. 182,717 filed Sept. 22, 1973, both of which are assigned to the assignee of the present invention.

SUMMARY OF THE PRESENT INVENTION

The present invention relates generally to bootstrap inverter circuits and more specifically to clocked bootstrap inverter circuits having particular application in MOSFET integrated circuits.

The presently preferred embodiment of the present invention includes a first FET providing an inverter responsive to an input signal, a second FET providing an active load for the inverter, a capacitor providing a bootstrapping circuit for the active load, a third FET responsive to a first clocking signal and operative to bias the active load conductive, a fourth FET responsive to a second clocking signal and operative to bias the active load nonconductive, and a fifth FET responsive to a third clocking signal and operative to disable the inverter. In an alternate embodiment, the third and fourth FETs are replaced by a single FET which is at all times biased conductive and responds to the first clocking signal to alternately bias the active load conductive and nonconductive.

Among the advantages of the present invention is that the power consumed during the operation of the device is substantially reduced by an amount proportional to the duty cycle of the first clocking signal.

Other advantages of the present invention will no doubt become apparent to those of ordinary skill in the art after having read the following detailed disclosure of the preferred embodiments which are illustrated in the several figures of the drawing.

IN THE DRAWING

DETAILED DESCRIPTION OF THE PREFERRED EMBODIMENTS

Figure 1:
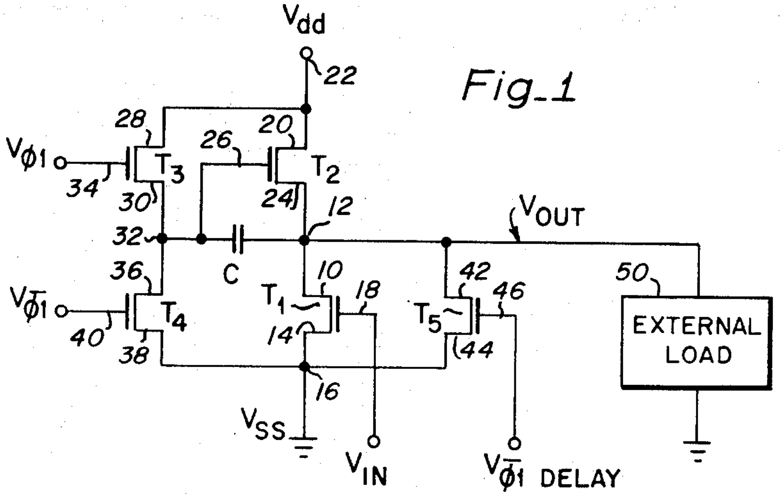
FIG. 1 is a schematic diagram of a clocked bootstrap oscillator circuit in accordance with the present invention.

Referring now to FIG. 1 of the drawing, a presently preferred embodiment of a clocked bootstrap circuit is illustrated. The circuit includes an inverting amplifier formed by a field effect transistor (FET) $T_1$, an active load for transistor $T_1$ formed by an FET $T_2$, a clocked biasing circuit for transistor $T_2$ including a pair of FETs $T_3$ and $T_4$, a capacitor C forming a bootstrapping feedback path for transistor $T_2$ and a clocked amplifier disabling means formed by an FET $T_5$.

The drain 10 of transistor $T_1$ is coupled to a circuit node 12, which also serves as the output terminal for the circuit, while the drain 14 is coupled to a circuit ground (a first source of potential $V_{ss}$) at 16. The circuit input signal $V_{in}$ is applied to the gate 18 of transistor $T_1$ via input terminal 19. The drain 20 of transistor $T_2$ is coupled to a second source of potential $V_{dd}$ at terminal 22 while its source 24 is coupled to circuit node 12. A capacitor C provides a bootstrapping feedback circuit coupling the gate 26 of transistor $T_2$ to circuit node 12.

The drain 28 of transistor $T_3$ is coupled to $V_{dd}$ at terminal 22 while its source 30 is coupled to a circuit node 32 (at the gate 26 of transistor $T_2$). The gate 34 of transistor $T_3$ is periodically energized by a first clocking signal $V\phi 1$. The drain 36 of transistor $T_4$ is coupled to circuit node 32 while its source 38 is coupled to circuit ground at 16. The gate 40 of transistor $T_4$ is periodically energized by a second clocking signal $V_{\Phi \bar{1}}$ which is 180° out of phase with the first clocking signal $V_{\Phi 1}$.

Transistor $T_5$ has its drain 42 coupled to circuit node 12 and its source 44 coupled to circuit ground at 16 while its gate 46 is energized by a third clocking signal $V_{\Phi \bar{1}}$delay which is a delayed version of clocking signal $V_{\Phi \bar{1}}$.

The phase angle between $V_{\Phi 1}$ and $V_{\Phi \bar{1}}$delay is selected sufficiently larger than 180° to enable capacitor C to be charged to $(V_{dd}-V_T)$ before transistor $T_5$ is rendered nonconductive.

Transistor $T_1$ responds to the input signal $V_{in}$ to develop an output signal $V_{out}$ at node 12 for driving the external load 50. Transistor $T_2$ and capacitor C, of course, provide a bootstrapped active load for transistor $T_1$; the bootstrapping action providing for high speed circuit operation. The function of the clocked biasing circuit formed by transistors $T_3$ and $T_4$ is to limit the power consumption of the overall circuit by periodically disabling the ctive load transistor $T_2$ so that the average power consumed by the circuit is reduced. More specifically, the average power consumed by the circuit is proportional to the duty cycle of the first clocking signal $V_{\Phi 1}$.

Transistor $T_5$ acts as an inverter disabling device and serves to maintain node 12 at $V_{ss}$ for a selected delay period during which capacitor C is charged to approximately $(V_{dd}-V_T)$ and transistor $T_2$ is thereby rendered conductive as the potential at node 32 moves toward $(V_{dd}-V_T)$. $V_T$ is the threshold potential of transistor $T_3$. At a predetermined time following the initiation of the charging cycle for capacitor C, transistor $T_5$ is rendered nonconductive by the clocking signal $V_{\Phi \bar{1}}$ delay thereby allowing node 12 to move toward $V_{dd}$. As this occurs, bootstrapping capacitor C causes circuit node 32 to be charged to approximately $(2V_{dd}-V_T)$.

Figure 2:
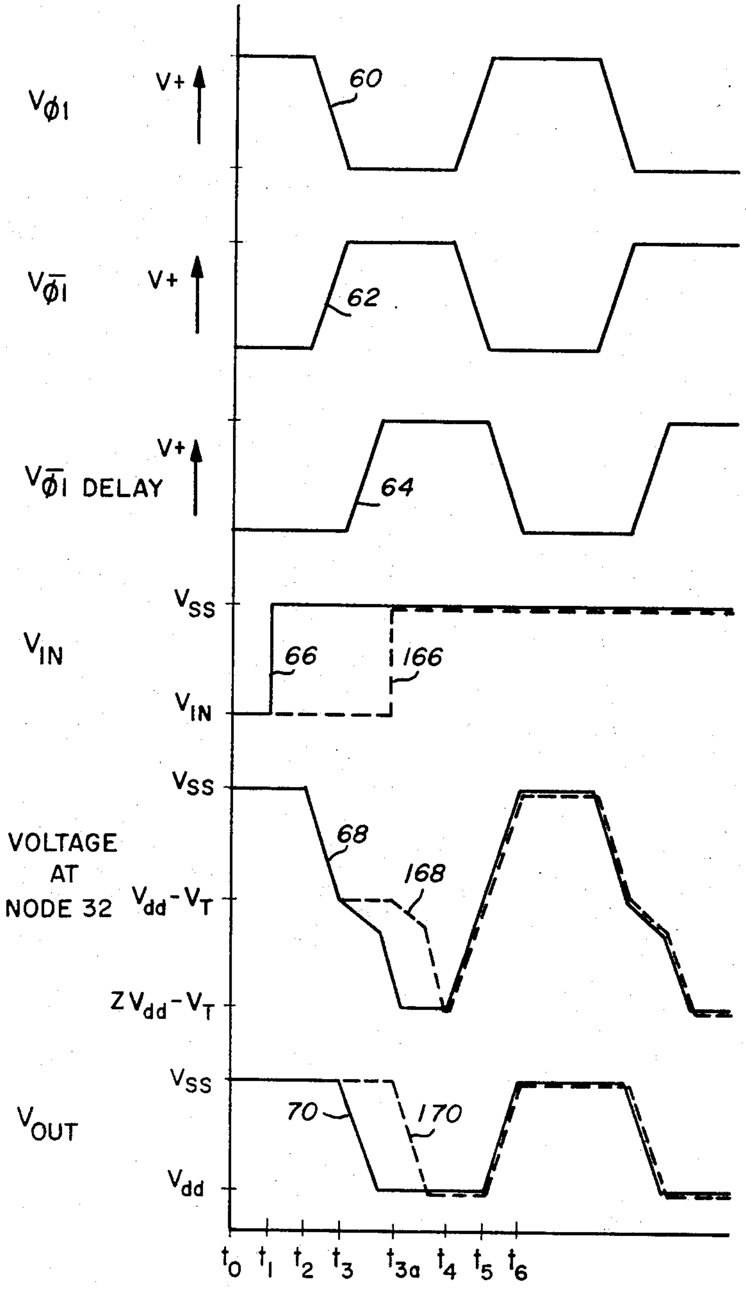
FIG. 2 is a timing diagram illustrating operation of the preferred embodiments of the present invention.

Referring now additionally to the operation of the circuit in FIG. 2 of the drawing will be described in detail. In FIG. 2 the clocking signals $V_{\Phi 1}$, $V_{\Phi \bar{1}}$, and $V_{\Phi \bar{1}}$delay are shown at 60, 62, and 64 respectively, $V_{in}$ is illustrated at 66, the potential developed at node 32 is shown at 68, and the output signal $V_{out}$ is shown at 70.

With the various illustrated signals applied, the circuit at time $t_0$, it will be noted that transistor $T_1$ is initially biased conductive by $V_{in}$ thereby making $V_{out} = V_{ss}$, transistor $T_2$ is nonconductive since transistor $T_3$ is nonconductive and transistor $T_4$ is conductive thereby pulling the gate 26 of transistor $T_2$ to $V_{ss}$, and transistor $T_5$ is also biased conductive.

If now, at time $t_1$, $V_{in}$ changes state, so as to cause transistor $T_1$ to be rendered nonconductive, the output signal $V_{out}$ will not change since transistor $T_5$ is still conductive and holds $V_{out}$ at the potential $V_{ss}$. However, at time $t_2$, the clocking signals $V\Phi_1$ and $V\Phi_{\bar{1}}$ begin to change state causing transistor $T_3$ to become conductive and transistor $T_4$ to become nonconductive. As indicated by curve 68, this causes node 32 to be pulled to approximately $(V_{dd}-V_T)$. Note that for a short period of time following $t_2$, node 12 is held at $V_{ss}$ by transistor $T_5$ so as to allow capacitor C to be charged to $(V_{dd}-V_T)$. After the predetermined delay period, typically about 40 nanoseconds, transistor $T_5$ is rendered conductive as $V\Phi_{\bar{1}}$ delay changes state and bootstrapping action, effected as node 12 begins to move toward $V_{dd}$, causes the conductivity of transistor $T_2$ to be further increased to decrease the time required to pull node 12 to $V_{dd}$.

At time $t_4$, clocking signals $V\Phi_1$, and $V\Phi_{\bar{1}}$ again change state causing node 32 to be pulled to $V_{ss}$, thereby discharging capacitor C and rendering transistor $T_2$ nonconductive. $V_{out}$, however, remains at $V_{dd}$ until time $t_5$ when transistor $T_5$ is rendered conductive to pull node 12 to $V_{ss}$. This operation will, of course, be repeated each time clocks $V\Phi_1$ and $V\Phi_{\bar{1}}$ change state so that the average power consumed by the circuit will be proportional to the duty cycle of $V\Phi_1$.

Although in the clocked bootstrap circuit an additional component of power dissipation is added due to capacitive charging and discharging, the total power dissipation can be considerably reduced (compared to a DC bootstrap circuit) if the duty cycle is kept small and the frequency of $\Phi_1$ is relatively small. Note that the output signal $V_{out}$ will have a pulsed configuration during the time that the inversion of input signal $V_{in}$ occurs.

Figure 3:
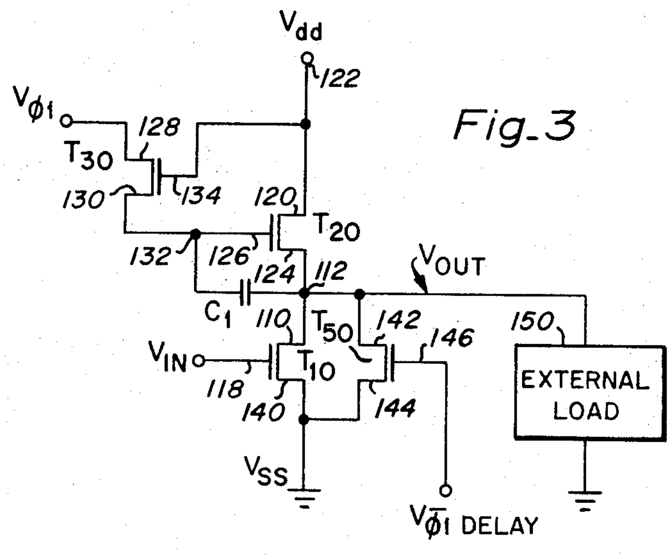
FIG. 3 is a schematic diagram of an alternative embodiment of a clocked bootstrap inverter in accordance with the present invention.

In FIG. 3 of the drawing an alternative embodiment of the present invention is shown which requires one less component to achieve similar results to those obtained in the previously described embodiment. As in the previous embodiment, this circuit includes an inverting FET $T_{10}$, an active load FET $T_{20}$, a clocked biasing FET $T_{30}$ for biasing transistor $T_{20}$ and a gating FET $T_{50}$. Note that the principle differences between this circuit and that of FIG. 1 are that the fourth biasing transistor $T_4$ is omitted and the clocking signal $V\Phi_1$ is applied to the drain 128 of transistor $T_{30}$ while the gate 134 thereof is coupled to $V_{dd}$ at terminal 122.

The operation of this circuit can likewise be described with reference to FIG. 2 of the drawing since the clocking input signals $V\Phi_1$ and $V\Phi_{\bar{1}}$ delay are identical to those of the FIG. 1 embodiment. At some time $t_0$ with $V_{in}$ applied to the base 118 of transistor $T_{10}$ and the clock potentials $V\Phi_1$ and $V\Phi_{\bar{1}}$ delay having the states indicated at 60 and 64, transistor $T_{10}$ and transistor $T_{50}$ are both conductive so that the potential $V_{out}$ at node 112 is at circuit ground ($V_{ss}$). Transistor $T_{30}$ is also conductive since $V_{dd}$ is applied to its gate 134. This pulls the potential at node 132, and hence, gate 126 of transistor $T_{20}$, to $V_{ss}$ so that transistor $T_{20}$ is nonconductive.

To indicate that in these circuits the timing of $V_{in}$ is not necessarily fixed with respect to the clocking signals, $V_{in}$ is selected so that it changes state at a time $t_{3a}$ (see dashed curve 166) instead of at time $t_1$ as in the previous example. This being the case, note that even though transistor $T_{20}$ is rendered conductive at time $t_2$ and transistor $T_{50}$ is rendered nonconductive at time $t_3$, the output signal $V_{out}$ does not begin to change state until $V_{in}$ changes state at time $t_{3a}$, as indicated by the dashed line 170. At time $t_4$, it will be noted that since a potential of $V_{dd}$ (where $V\Phi_1$ has an amplitude of $V_{dd}$) is applied to drain 128 of transistor $T_{30}$, the charge on capacitor $C_1$ will be approximately $(V_{dd}-V_T)$, since transistor $T_{30}$ is always conductive, and will remain at that potential until time $t_{3a}$ when transistor $T_{10}$ is rendered nonconductive allowing node 112 to be pulled to $V_{dd}$ through the conductive transistor $T_{20}$, thereby causing node 132 to be raised to $(2V_{dd}-V_T)$ due to the bootstrapping action of transistor $C_1$.

As in the previous embodiment, transistor $C_1$ will be discharged as $V\Phi_1$ changes state at time $t_4$. This will, of course, cause transistor $T_{20}$ to be rendered nonconductive. However, $V_{out}$ will remain at $V_{dd}$ until time $t_5$ when $V\Phi_{\bar{1}}$ delay changes state to pull $V_{out}$ to $V_{ss}$. $V_{out}$ will then continue to change state between $V_{dd}$ and $V_{ss}$ responding to $T_{1d}$ until $V_{in}$ changes state, at which time $V_{out}$ will be held at $V_{ss}$ until $V_{in}$ again changes state.

Although this circuit has the advantage that fewer FETs are required for its implementation, it is also subject to the disadvantage that it is more prone to lateral PNP action occurring on the MOS chip. To avoid this disadvantage, it is necessary that the circuit layout be carefully chosen to avoid such harmful PNP action.

Alternatively, the critical nodes can be surrounded by p-diffused regions which are tied to $V_{dd}$ to provide a PNP path to $V_{dd}$ thus reducing the probability of PNP action between the critical nodes and the rest of the circuit.

Although the present invention has been described above with particular reference to p-channel embodiments, as may be inferred from the illustrated signal polarities, it will be appreciated that the disclosed principles can likewise be applied to n-channel devices. In addition, the capacitors C and $C_1$ can be made in the form of a standard MOS capacitor or can be formed by the gate-to-channel capacitance of an additional FET in accordance with the teachings of my above referenced copending application entitled, "An Improved MOS Bootstrap Circuit."

Moreover, while the present invention has been described with reference to certain preferred embodiments, it is contemplated that additional alterations and/or modifications thereof will no doubt become apparent to those of ordinary skill in the art after having read the foregoing description. Accordingly, it is intended that the appended claims be interpreted as covering all such alterations and modifications as fall within the true spirit and scope of the invention.

What is claimed is:

1. A clocked bootstrap inverter circuit comprising
a first source of potential;
a second source of potential;
an inverting amplifier having an output terminal, and being responsive to an input signal and operative to develop an output signal at said output terminal, said amplifier including a first FET having a first gate for receiving said input signal, a first source coupled to said first source of potential and a first drain coupled to said output terminal;
an active load means for said amplifier including a boot-strapping circuit, said load means having a conductive state and a nonconductive state, said load means including a second FET having a second gate, a second source coupled to aid output terminal and a second drain coupled to said second source of potential;

biasing means responsive to a first clocking signal and operative to render said load means alternately conductive and nonconductive, said biasing means including a third FET and a fourth FET, said third FET having a third gate for receiving said first clocking signal, a third source coupled to said second gate, and a third drain coupled to said second source of potential, said fourth FET having a fourth gate for receiving a second clocking signal which is 180° out of phase with said first clocking signal, a fourth source coupled to said first source of potential and a fourth drain coupled to said second gate; and disabling means responsive to a third clocking signal and operative to periodically disable said amplifier, said disabling means including a fifth FET having a fifth gate for receiving said third clocking signal, a fifth source coupled to said first source of potential, and a fifth drain coupled to said output terminal, said third clocking signal being more than 180° out of phase with said first clocking signal.

2. A clocked bootstrap inverter circuit comprising a first source of potential;

a second source of potential;

an inverting amplifier having an output terminal, and being responsive to an input signal and operative to develop an output signal at said output terminal, said amplifier including a first FET having a first gate for receiving said input signal, a first source coupled to said first source of potential and a first drain coupled to said outut terminal;

an active load means for said amplifier including a boot-strapping circuit, said load means having a conductive state and a nonconductive state, said load means including a second FET having a second gate, a second source coupled to said output terminal and a second drain coupled to said second source of potential;

biasing means responsive to said first clocking signal and operative to render said load means alternately conductive and nonconductive, said biasing means including a third FET having a third gate coupled to said second source of potential, a third source coupled to said second gate, and a third drain for receiving said first clocking signal; and disabling means responsive to a second clocking signal and operative to periodically disable said amplifier.

3. A clocked bootstrap inverter circuit as recited in claim 2 wherein said disabling means includes a fourth FET having a fourth gate for receiving said second clocking signal, a fourth source coupled to said first source of potential, and a fourth drain coupled to said output terminal, said second clocking signal being more than 180° out of phase with said first clocking signal.

4. A clocked bootstrap inverter circuit comprising a first source of potential;

a second source of potential;

an inverting amplifier having an output terminal, and being responsive to an input signal and operative to develop an output signal at said output terminal;

an active load means for said amplifier including a boot-strapping circuit, said load means having a conductive state and a nonconductive state; said load means including a first FET having a first gate, a first source coupled to said output terminal, and a second drain coupled to said second source of potential;

biasing means responsive to a first clocking signal and operative to render said load means alternately conductive and nonconductive, said biasing means including, a second FET responsive to said first clocking signal and operative to couple said first gate to said second source of potential, and a third FET responsive to a second clocking signal and operative to couple said first gate to said first source of potential, said second clocking signal being 180° out of phase with said first clocking signal; and disabling means responsive to a third clocking signal and operative to periodically disable said amplifier, said disabling means including a fourth FET responsive to said third clocking signal and operative to couple said output terminal to said first source of potential, said third clocking signal being more than 180° out of phase with said first clocking signal.

5. A clocked bootstrap inverter circuit comprising a first source of potential;

a second source of potential;

an inverting amplifier having an output terminal, and being responsive to an input signal and operative to develop an output signal at said output terminal;

an active load means for said amplifier including a bootstrapping circuit, said load means having a conductive state and a nonconductive state, said load means including a first FET having a first gate, a first source coupled to said output terminal, and a first drain coupled to said second source of potential;

biasing means responsive to a first clocking signal and operative to render said load means alternately conductive and nonconductive, said biasing means including a second FET having a second gate coupled to said second source of potential, a second source coupled to said first gate, and a third drain for receiving said first clocking signal;

disabling means responsive to a second clocking signal and operative to periodically disable said amplifier, said disabling means including a third FET responsive to said second clocking signal and operative to couple said output terminal to said first source of potential.

* * * * *